(12) United States Patent
Han

(10) Patent No.: US 10,957,734 B2
(45) Date of Patent: Mar. 23, 2021

(54) BACKSIDE ILLUMINATED IMAGE SENSOR AND METHOD OF MANUFACTURING THE SAME

(71) Applicant: DB HITEK CO., LTD., Seoul (KR)

(72) Inventor: Chang Hun Han, Icheon-si (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/379,373

(22) Filed: Apr. 9, 2019

(65) Prior Publication Data

US 2019/0319054 A1 Oct. 17, 2019

(30) Foreign Application Priority Data

Apr. 11, 2018 (KR) ........................ 10-2018-0041935

(51) Int. Cl.
*H01L 27/146* (2006.01)

(52) U.S. Cl.
CPC .... *H01L 27/1464* (2013.01); *H01L 27/14621* (2013.01); *H01L 27/14623* (2013.01); *H01L 27/14627* (2013.01); *H01L 27/14685* (2013.01); *H01L 27/14629* (2013.01); *H01L 27/14638* (2013.01)

(58) Field of Classification Search
CPC ........... H01L 27/1464; H01L 27/14621; H01L 27/14685; H01L 27/1461; H01L 27/1462; H01L 27/14623

USPC ....... 257/432, 291, 292, 294; 438/48, 70, 65
See application file for complete search history.

(56) References Cited

U.S. PATENT DOCUMENTS

| 2014/0239431 A1* | 8/2014 | Miyashita | ......... H01L 27/14621 257/432 |
| 2016/0172394 A1* | 6/2016 | Lee et al. | .......... H01L 27/14605 257/432 |
| 2018/0069039 A1* | 3/2018 | Han et al. | ........... H01L 27/1464 |
| 2019/0094450 A1* | 3/2019 | Bae et al. | ............ G02B 6/0053 |

FOREIGN PATENT DOCUMENTS

KR 20120135627 A 12/2012

* cited by examiner

*Primary Examiner* — Thinh T Nguyen
(74) *Attorney, Agent, or Firm* — Patterson Thuente Pedersen, P.A.

(57) ABSTRACT

A backside illuminated image sensor includes pixel regions disposed in a substrate, a light-blocking pattern disposed on a backside surface of the substrate and having openings corresponding to the pixel regions, a color filter layer disposed on the light-blocking pattern, a micro lens array disposed on the color filter layer, and refraction patterns respectively disposed in the openings to condense light passing through the micro lens array and the color filter layer into the pixel regions.

16 Claims, 8 Drawing Sheets

BACKSIDE ILLUMINATED IMAGE SENSOR AND METHOD OF MANUFACTURING THE SAME

CROSS-REFERENCE TO RELATED APPLICATION

This application claims the priority benefit of Korean Patent Application No. 10-2018-0041935, filed on Apr. 11, 2018, and all the benefits accruing therefrom under 35 U.S.C. § 119, the contents of which are incorporated by reference in their entirety.

BACKGROUND

The present disclosure relates to a backside illuminated image sensor and a method of manufacturing the same.

In general, an image sensor is a semiconductor device that converts an optical image into electrical signals, and may be classified or categorized as a Charge Coupled Device (CCD) or a Complementary Metal Oxide Semiconductor (CMOS) Image Sensor (CIS).

The CIS includes unit pixels, each including a photodiode and MOS transistors. The CIS sequentially detects the electrical signals of the unit pixels using a switching method, thereby forming an image. The CIS may be classified as either a frontside illuminated image sensor or a backside illuminated image sensor.

The frontside illuminated image sensor may include photodiodes formed in a substrate, transistors formed on a frontside surface of the substrate, wiring layers formed on the frontside surface of the substrate, and a color filter layer and micro lens array formed on the wiring layers.

Meanwhile, the backside illuminated image sensor may have an improved light-receiving efficiency in comparison with the frontside illuminated image sensor. The backside illuminated image sensor may include transistors and wiring layers formed on a frontside surface of a substrate, a light-blocking pattern and an anti-reflective layer formed on a backside surface of the substrate, a passivation layer formed on the light-blocking pattern and the anti-reflective layer, and a color filter layer and a micro lens array formed on the passivation layer.

The light-blocking pattern may be made of tungsten and may be formed by forming a tungsten layer on the anti-reflective layer and patterning the tungsten layer to have openings corresponding to pixel regions of the backside illuminated image sensor. The light-blocking pattern may be used to improve the crosstalk of the backside illuminated image sensor. However, the light condensing efficiency of the backside illuminated image sensor may be reduced by the light-blocking pattern.

SUMMARY

The present disclosure provides a backside illuminated image sensor having improved light condensing efficiency and crosstalk and a method of manufacturing the backside illuminated image sensor.

In accordance with an aspect of the present disclosure, a backside illuminated image sensor has a backside surface and a frontside surface arranged opposite one another. The backside illuminated image sensor may include a plurality of pixel regions disposed in a substrate that defines the frontside surface and the backside surface. A light-blocking pattern may be disposed on the backside surface and define a plurality of openings, each of which corresponds to one of the plurality of pixel regions. A color filter layer may be disposed on the light-blocking pattern. A micro lens array may be disposed on the color filter layer, and a plurality of refraction patterns may be disposed in a corresponding one of the plurality of openings to condense light passing through the micro lens array and the color filter layer into the pixel regions.

In accordance with some exemplary embodiments of the present disclosure, each of the refraction patterns may have inclined side surfaces so that a width of the refraction patterns is thicker proximal to the backside surface and thinner distal to the backside surface.

In accordance with some exemplary embodiments of the present disclosure, the backside illuminated image sensor may further include a planarization layer disposed on the light-blocking pattern and the refraction patterns, wherein the color filter layer may be disposed on the planarization layer.

In accordance with some exemplary embodiments of the present disclosure, the refraction patterns may have a refractive index higher than that of the planarization layer.

In accordance with some exemplary embodiments of the present disclosure, the refraction patterns may include silicon nitride.

In accordance with some exemplary embodiments of the present disclosure, the backside illuminated image sensor may further include an anti-reflective layer disposed on the backside surface of the substrate.

In accordance with some exemplary embodiments of the present disclosure, the anti-reflective layer may include a metal oxide layer disposed on the backside surface of the substrate, a silicon oxide layer disposed on the metal oxide layer, and a silicon nitride layer disposed on the silicon oxide layer.

In accordance with some exemplary embodiments of the present disclosure, the backside illuminated image sensor may further include an insulating layer disposed on the anti-reflective layer, wherein the light-blocking pattern and the refraction patterns may be disposed on the insulating layer.

In accordance with some exemplary embodiments of the present disclosure, each of the pixel regions may include a charge accumulation region disposed in the substrate and a frontside pinning layer disposed between the frontside surface and the charge accumulation region.

In accordance with some exemplary embodiments of the present disclosure, the each of the pixel regions may further include a backside pinning layer disposed between the backside surface and the charge accumulation region.

In accordance with another aspect of the present disclosure, a method of manufacturing a backside illuminated image sensor may include forming a plurality of pixel regions in a substrate that defines a frontside surface and a backside surface, forming a light-blocking pattern defining a plurality of openings on the backside surface, each of the plurality of openings corresponding to one of the plurality of pixel regions, forming a plurality of refraction patterns, wherein each of the plurality of refraction patterns is arranged in a corresponding one of the plurality of openings, forming a color filter layer on the light-blocking pattern and the plurality of refraction patterns, and forming a micro lens array on the color filter layer, wherein the plurality of refraction patterns may be configured to condense light passing through the micro lens array and the color filter layer into the pixel regions.

In accordance with some exemplary embodiments of the present disclosure, forming the refraction patterns may include forming preliminary refraction patterns in the openings and removing edge portions of the preliminary refraction patterns to form the refraction patterns, wherein each of the refraction patterns may have inclined side surfaces so that it is thicker proximal to the backside surface and thinner distal to the backside surface.

In accordance with some exemplary embodiments of the present disclosure, forming the refraction patterns may further include forming photoresist patterns each having inclined side surfaces on the preliminary refraction patterns, wherein the edge portions of the preliminary refraction patterns may be removed by an anisotropic etching process using the photoresist patterns as an etching mask.

In accordance with some exemplary embodiments of the present disclosure, the photoresist patterns may be removed at the same rate as the preliminary refraction patterns during the anisotropic etching process.

In accordance with some exemplary embodiments of the present disclosure, the method may further include forming a planarization layer on the light-blocking pattern and the refraction patterns, wherein the color filter layer may be formed on the planarization layer.

In accordance with some exemplary embodiments of the present disclosure, the refraction patterns may have a refractive index higher than a refractive index of the planarization layer.

In accordance with some exemplary embodiments of the present disclosure, the refraction patterns may include silicon nitride.

In accordance with some exemplary embodiments of the present disclosure, the method may further include performing a heat treatment process to remove defects of the refraction patterns.

In accordance with some exemplary embodiments of the present disclosure, the method may further include forming an anti-reflective layer on the backside surface of the substrate.

In accordance with some exemplary embodiments of the present disclosure, the method may further include forming an insulating layer on the anti-reflective layer, wherein the light-blocking pattern and the plurality of refraction patterns may be formed on the insulating layer.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
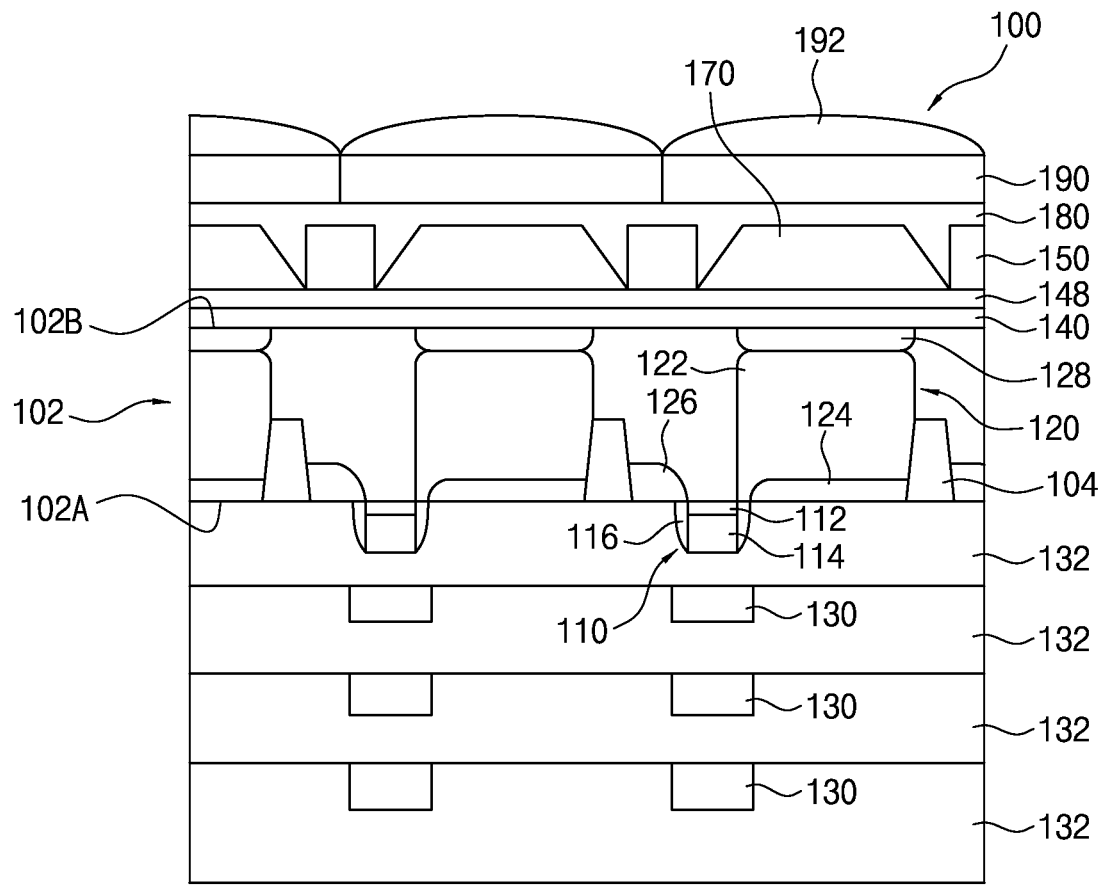
FIG. 1 is a cross-sectional view illustrating a backside illuminated image sensor in accordance with an exemplary embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter or as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms. The term "between" is used herein to describe both mechanical arrangements (i.e., that an object is physically between two others in some dimension) or alternatively that it is in between two other components in an electrical connection.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not limited to the specific forms or areas in the drawings, and should be understood to include deviations of the exact forms shown and described. The areas may be entirely schematic, and their forms may not describe or depict accurate forms or structures in any given area or other dimension, and are not intended to limit the scope of the present invention.

Figure 2:
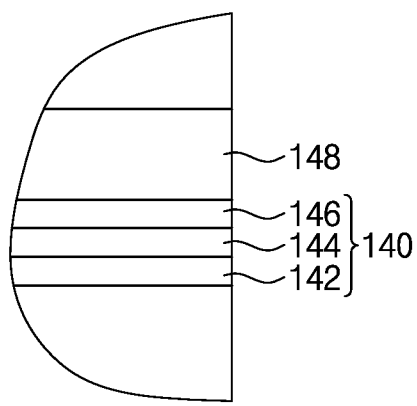
FIG. 2 is an enlarged cross-sectional view illustrating an anti-reflective layer as shown in FIG. 1.

FIG. 1 is a cross-sectional view illustrating a backside illuminated image sensor in accordance with an exemplary embodiment of the present disclosure, and FIG. 2 is an enlarged cross-sectional view illustrating an anti-reflective layer as shown in FIG. 1.

Referring to FIG. 1, a backside illuminated image sensor 100, in accordance with an exemplary embodiment of the present disclosure, may include pixel regions 120 disposed in a substrate 102, a light-blocking pattern 150 disposed on a backside surface 102B of the substrate 102 and having openings 152 (refer to FIG. 8) corresponding to the pixel regions 120, a color filter layer 190 disposed on the light-blocking pattern 150, and a micro lens array 192 disposed on the color filter layer 190. Particularly, refraction patterns 170 may be disposed in the openings 152, respectively, in order to condense light passing through the micro lens array 192 and the color filter layer 190 into the pixel regions 120.

Each of the pixel regions 120 may include a charge accumulation region 122 in which charges generated by the incident light are accumulated. The charge accumulation regions 122 may be disposed in the substrate 102, and floating diffusion regions 126 may be disposed in frontside surface portions of the substrate 102 to be spaced apart from the charge accumulation regions 122.

The substrate 102 may have a first conductivity type, and the charge accumulation regions 122 and the floating diffusion regions 126 may have a second conductivity type. For example, a p-type substrate may be used as the substrate 102, and n-type impurity diffusion regions functioning as the charge accumulation regions 122 and the floating diffusion regions 126 may be formed in the p-type substrate 102.

Transfer gate structures 110 may be disposed on channel regions between the charge accumulation regions 122 and the floating diffusion regions 126 to transfer the charges accumulated in the charge accumulation regions 122 to the floating diffusion regions 126. Each of the transfer gate structures 110 may include a gate insulating layer 112 disposed on a frontside surface 102A of the substrate 102, a gate electrode 114 disposed on the gate insulating layer 112, and gate spacers 116 disposed on side surfaces of the gate electrode 114. Further, though not shown in figures, the backside illuminated image sensor 100 may include reset transistors, source follower transistors, and select transistors electrically connected with the floating diffusion regions 126.

Alternatively, if the backside illuminated image sensor 100 is a 3T (or fewer than three transistors) layout, the transfer gate structures 110 may be used as reset gate structures and the floating diffusion regions 126 may be used as active regions for connecting the charge accumulation regions 122 with reset circuitries.

The pixel regions 120 may include a frontside pinning layer 124 disposed between the frontside surface 102A of the substrate 102 and the charge accumulation region 122, respectively. Further, the pixel regions 120 may include a backside pinning layer 128 disposed between a backside surface 102B of the substrate 102 and the charge accumulation region 122, respectively. The frontside and backside pinning layers 124 and 128 may have the first conductivity type. For example, p-type impurity diffusion regions may be used as the frontside and backside pinning layers 124 and 128.

Wiring layers 130 may be disposed on the frontside surface 102A of the substrate 102 and may be electrically connected with the pixel regions 120. Further, insulating layers 132 may be disposed on the frontside surface 102A of the substrate 102 and between the wiring layers 130.

An anti-reflective layer 140 may be disposed on the backside surface 102B of the substrate 102.

Referring to FIG. 2, the anti-reflective layer 140 may include a metal oxide layer 142 disposed on the backside surface 102B (FIG. 1) of the substrate 102 (FIG. 1), a silicon oxide layer 144 disposed on the metal oxide layer 142, and a silicon nitride layer 146 disposed on the silicon oxide layer 144.

The metal oxide layer 142 may function as a fixed charge layer. For example, the metal oxide layer 142 may function as a negative fixed charge layer and include hafnium oxide ($HfO_2$), hafnium oxynitride (HfON), aluminum oxide ($Al_2O_3$), aluminum oxynitride (AlON), hafnium aluminum oxide (HfAlO) or hafnium aluminum oxynitride (HfAlON), for example. In such case, negative charges of the negative fixed charge layer may form a negatively charged shallow minority carrier rich region, i.e., a hole accumulation region, in a backside surface portion of the substrate 102, and the hole accumulation region may improve the function of the backside pinning layers 128.

Alternatively, when the charge accumulation region 122 has the first conductivity type, that is, an n-type substrate is used as the substrate 102 and the charge accumulation region 122 include p-type impurities, the metal oxide layer 142 may function as a positive fixed charge layer and include zirconium oxide ($ZrO_2$), hafnium silicon oxide ($HfSiO_2$), hafnium silicon oxynitride (HfSiON) or silicon nitride ($Si_3N_4$), for example. In such case, the positive fixed charge layer may form an electron accumulation region in a backside surface portion of the substrate 102.

Referring again to FIG. 1, an insulating layer 148, e.g., a silicon oxide layer, may be disposed on the anti-reflective layer 140, and the light-blocking pattern 150 may be disposed on the insulating layer 148. The light-blocking pattern 150 may have openings 152 (FIG. 8) corresponding to the pixel regions 120, and may be made of a metallic material, e.g., tungsten.

The refraction patterns 170 may be disposed on the openings 152, such that each opening 152 corresponds to a refraction pattern 170, and a planarization layer 180 may be disposed on the light-blocking pattern 150 and the refraction patterns 170. For example, the planarization layer 180 may be made of silicon oxide or photoresist. The color filter layer 190 may be disposed on the planarization layer 180, and the micro lens array 192 may be disposed on the color filter layer 190.

The refraction patterns 170 may be used to condense the light passing through the micro lens array 192 and the color filter layer 190 into the pixel regions 120. For example, each of the refraction patterns 170 may have inclined side surfaces 170A (refer to FIG. 11) so that a width of the refraction patterns 170 is reduced upward. The refraction patterns 170 may have a refractive index higher than that of the planarization layer 180 to refract the light incident on the inclined side surfaces 170A into the pixel regions 120. For example, the refraction patterns 170 may be made of silicon nitride. As a result, the light condensing efficiency of the backside illuminated image sensor 100 may be significantly increased, and the crosstalk of the backside illuminated image sensor 100 may be decreased.

FIGS. 3 to 12 are cross-sectional views illustrating a method of manufacturing the backside illuminated image sensor as shown in FIG. 1.

Figure 3:
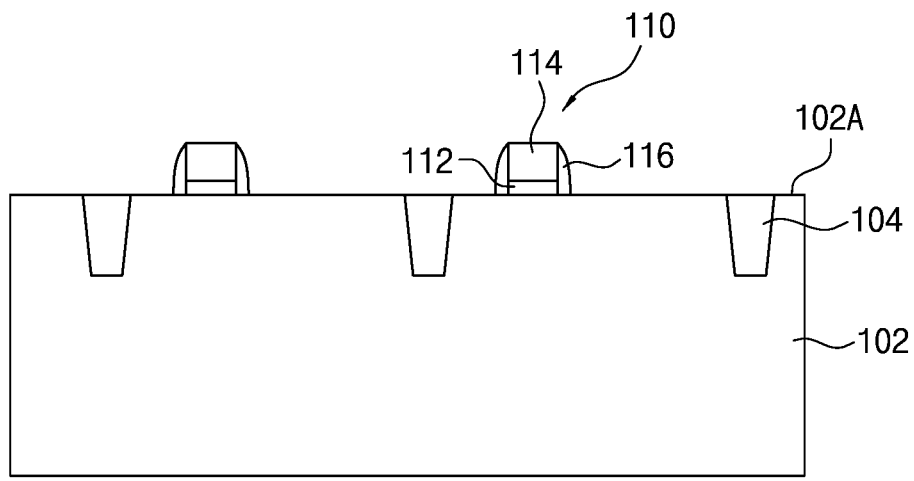
FIGS. 3 to 12 are cross-sectional views illustrating a method of manufacturing the backside illuminated image sensor as shown in FIG. 1.

Referring to FIG. 3, device isolation regions 104 may be formed in frontside surface portions of a substrate 102 to define active regions of the backside illuminated image sensor 100. The substrate 102 may have a first conductivity type. For example, a p-type substrate may be used as the substrate 102. Alternatively, the substrate 102 may include a bulk silicon substrate and a p-type epitaxial layer formed on the bulk silicon substrate. The device isolation regions 104 may be made of silicon oxide and may be formed by a Shallow Trench Isolation (STI) process.

In addition to forming the device isolation regions 104, transfer gate structures 110 may be formed on a frontside surface 102A of the substrate 102. Each of the transfer gate structures 110 may include a gate insulating layer 112, a gate electrode 114 formed on the gate insulating layer 112 and gate spacers 116 formed on side surfaces of the gate electrode 114. Further, though not shown in figures, reset gate structures, source follower gate structures and select gate structures may be formed with the transfer gate structures 110 on the frontside surface 102A of the substrate 102.

Figure 4:
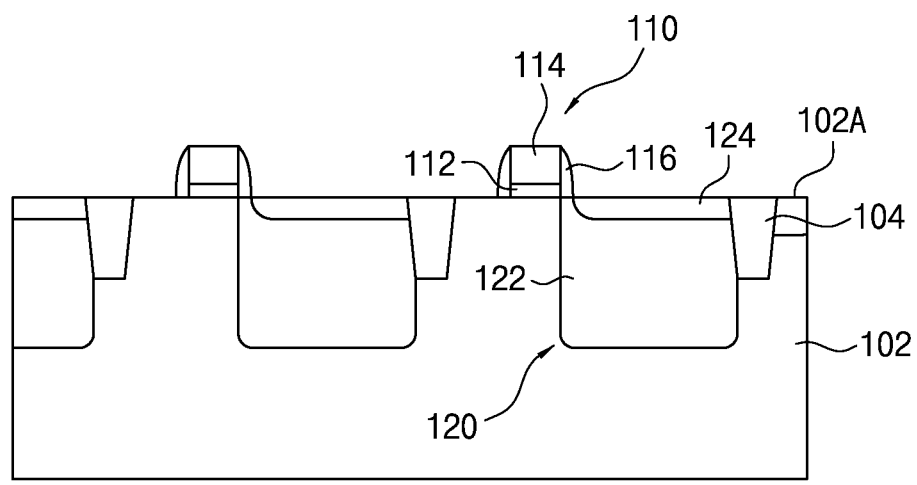

Referring to FIG. 4, charge accumulation regions 122 used in pixel regions 120 may be formed in the substrate 102. In detail, charge accumulation regions 122 having a second conductivity type may be formed in the active regions of the substrate 102. For example, n-type charge accumulation regions 122 may be formed in the p-type substrate 102. The n-type charge accumulation regions 122 may be n-type impurity diffusion regions formed by an ion implantation process.

Frontside pinning layers 124 having the first conductivity type may be formed between the frontside surface 102A of the substrate 102 and the charge accumulation regions 122. For example, p-type frontside pinning layers 124 may be formed between the frontside surface 102A of the substrate 102 and the n-type charge accumulation regions 122 by an ion implantation process. The p-type frontside pinning layers 124 may be p-type impurity diffusion regions. The n-type charge accumulation regions 122 and the p-type frontside pinning layers 124 may be activated by a subsequent rapid heat treatment process.

Figure 5:
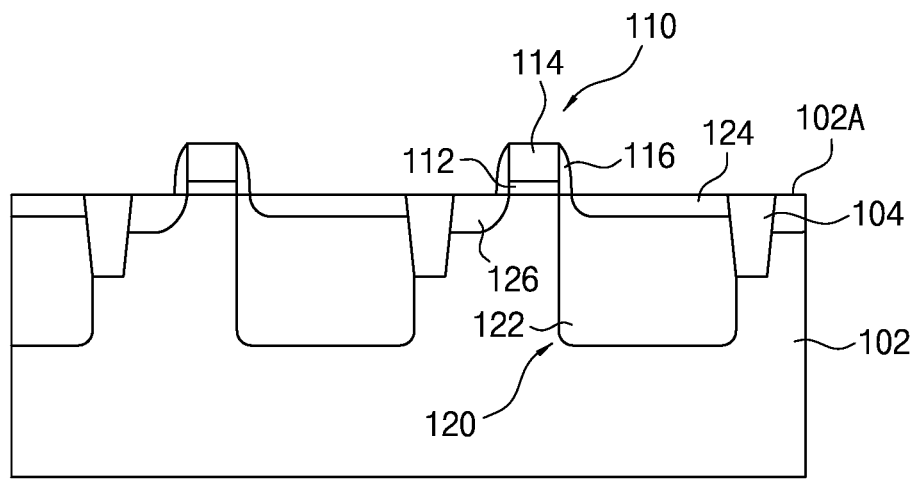

Referring to FIG. 5, floating diffusion regions 126 having the second conductivity type may be formed in frontside surface portions of the substrate 102 to be spaced apart from the charge accumulation regions 122. For example, the floating diffusion regions 126 may be n-type high concentration impurity regions, which may be formed by an ion implantation process. The transfer gate structures 110 may be arranged on channel regions between the charge accumulation regions 122 and the floating diffusion regions 126.

Figure 6:
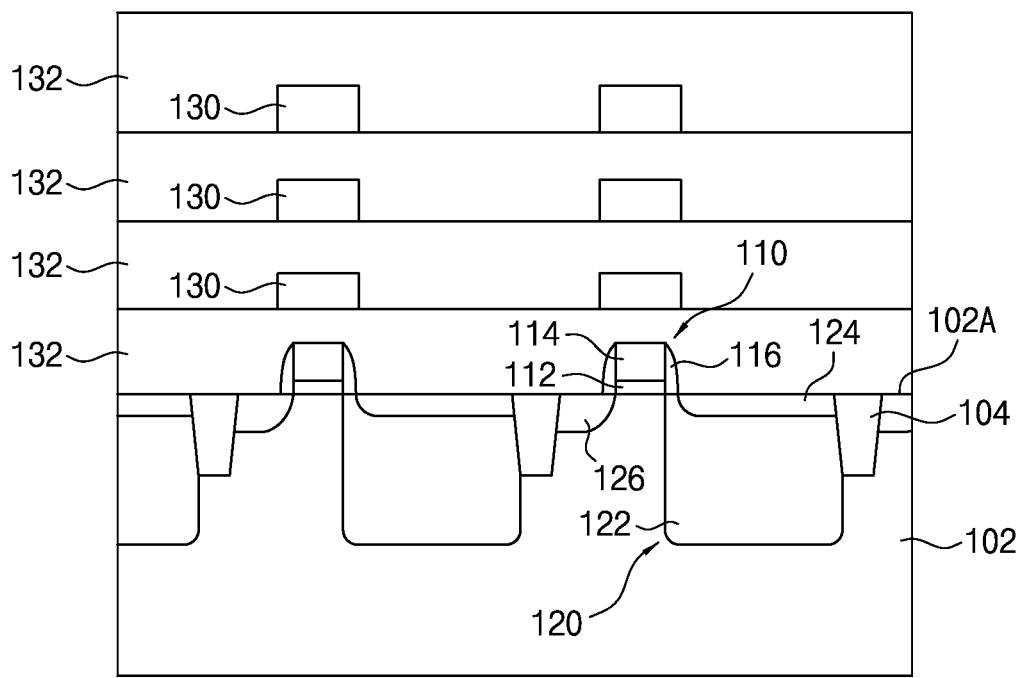

Referring to FIG. 6, wiring layers 130 may be formed on the frontside surface 102A of the substrate 102 to be electrically connected with the pixel regions 120. Further, insulating layers 132 may be formed on the frontside surface 102A of the substrate 102 and between the wiring layers 130.

Figure 7:
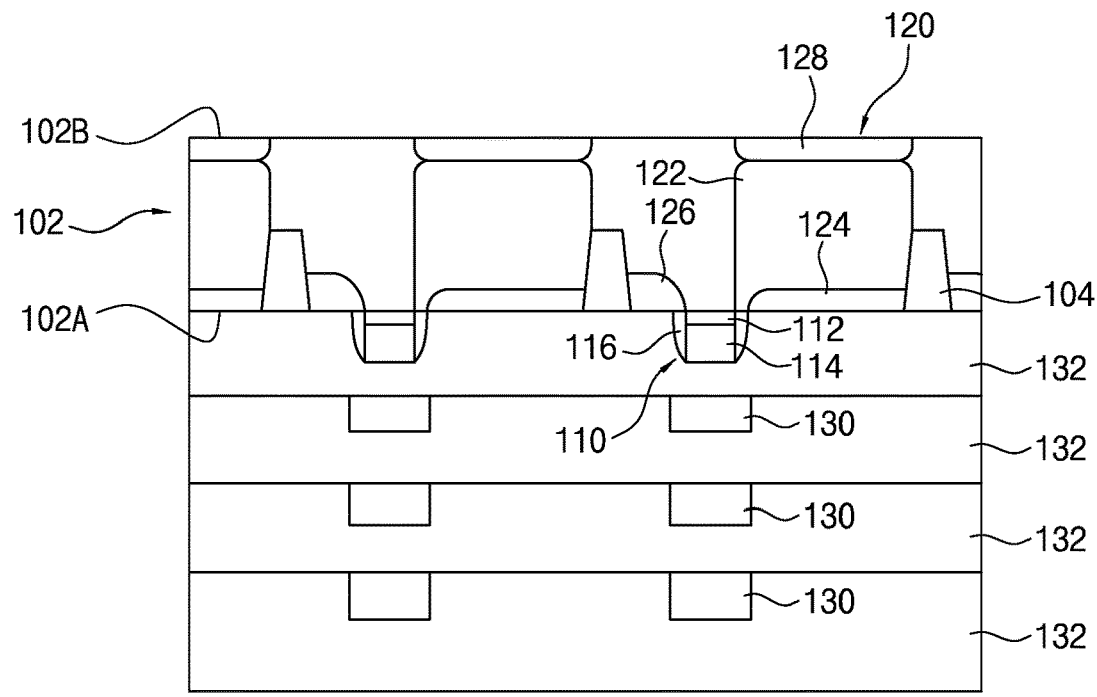

Referring to FIG. 7, a back-grinding process or a chemical and mechanical polishing process may be performed in order to reduce a thickness of the substrate 102. Further, backside pinning layers 128 having the first conductivity type may be formed between a backside surface 102B of the substrate 102 and the charge accumulation regions 122. For example, p-type impurity regions functioning as the backside pinning layers 128 may be formed by an ion implantation process, and may then be activated by a subsequent laser annealing process.

In embodiments, the backside pinning layers 128 may be formed prior to the charge accumulation regions 122. For example, after forming the backside pinning layers 128, the charge accumulation regions 122 may be formed on the backside pinning layers 128, and the frontside pinning layers 124 may then be formed on the charge accumulation regions 122. In such case, the backside pinning layers 128 may be activated by the rapid heat treatment process along with the charge accumulation regions 122 and the frontside pinning layers 124. Further, the back-grinding process may be performed such that the backside pinning layers 128 are exposed.

When the substrate 102 includes a bulk silicon substrate and a p-type epitaxial layer formed on the bulk silicon substrate, the charge accumulation regions 122 and the frontside and backside pinning layers 124 and 128 may be formed in the p-type epitaxial layer, and the bulk silicon substrate may be removed by the back-grinding process.

Figure 8:
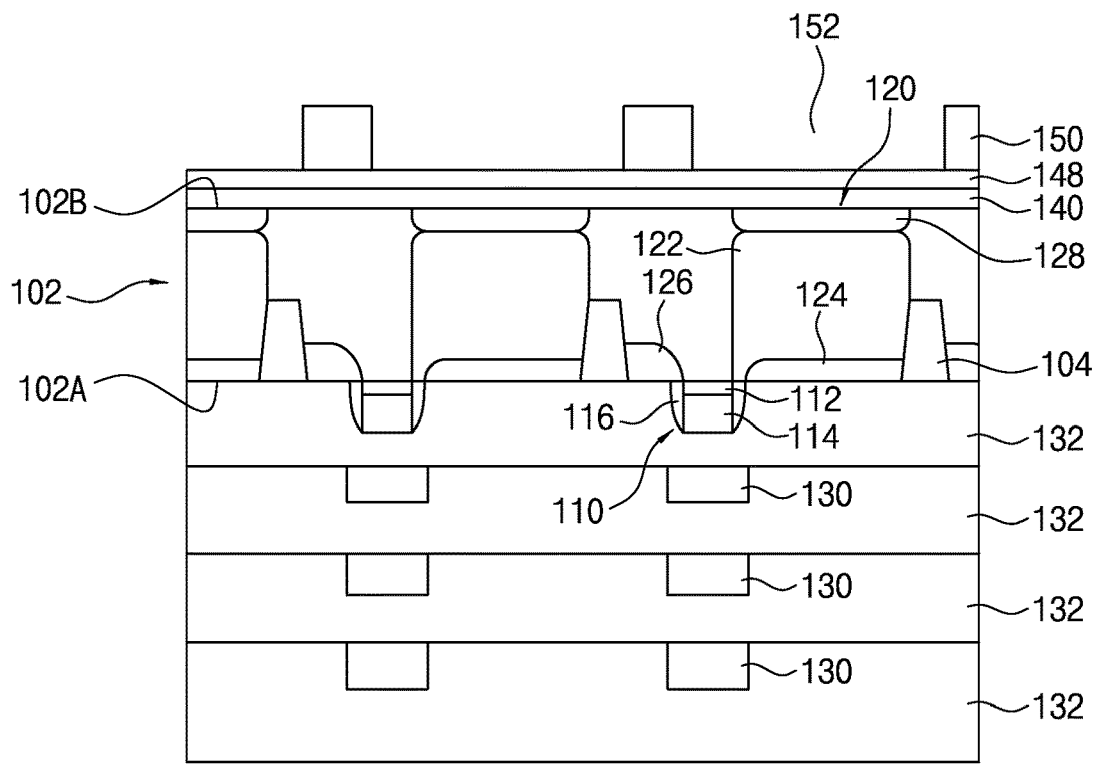

Referring to FIG. 8, an anti-reflective layer 140 may be formed on the backside surface 102B of the substrate 102, and an insulating layer 148 may be formed on the anti-reflective layer 140. For example, a metal oxide layer 142, a silicon oxide layer 144 and a silicon nitride layer 146 may be sequentially formed on the backside surface 102B of the substrate 102, and a silicon oxide layer used as the insulating layer 148 may be formed on the silicon nitride layer 146, as described above with respect to FIG. 2.

A light-blocking pattern 150 having openings 152 corresponding to each of the pixel regions 120 may be formed on the insulating layer 148. The light-blocking pattern 150 may be made of a metallic material. For example, a tungsten layer (not shown) may be formed on the insulating layer 148, and the light-blocking pattern 150 may then be formed on the insulating layer 148 by patterning the tungsten layer.

Figure 9:
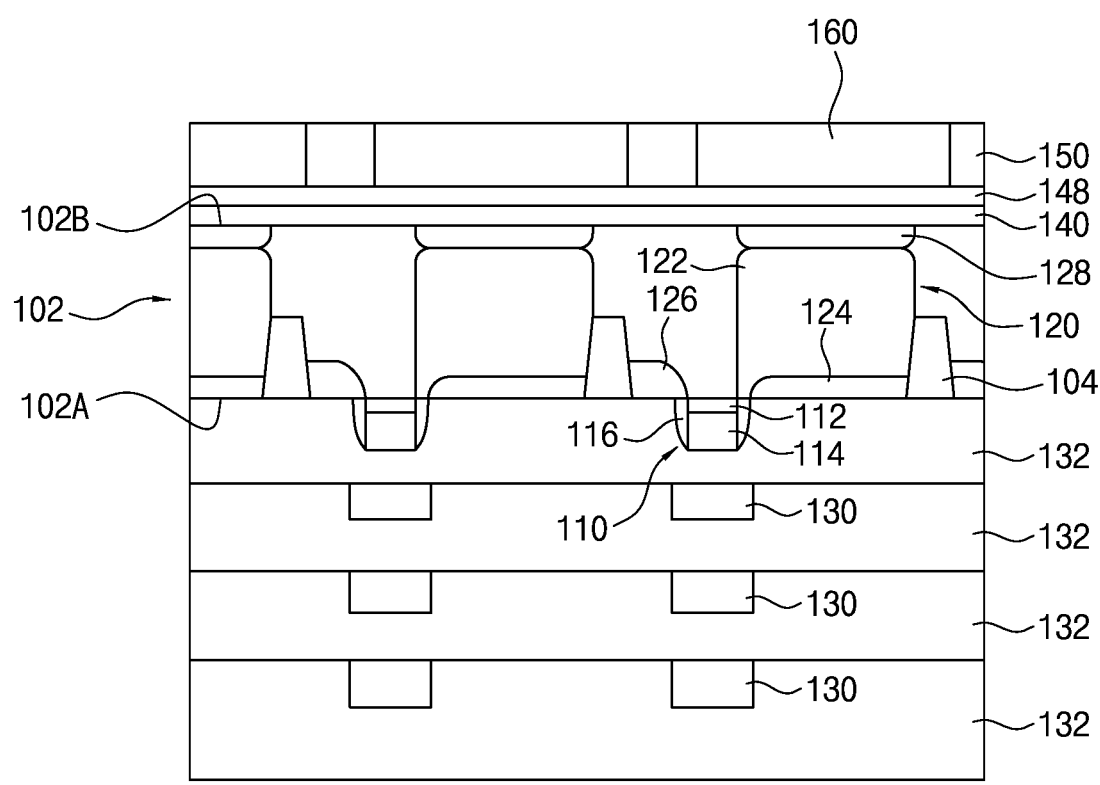

Referring to FIG. 9, preliminary refraction patterns 160 may be formed in the openings 152. For example, a refraction layer (not shown) may be formed on the light-blocking pattern 150 and the insulating layer 148 so that the openings 152 are filled with the refraction layer. Then, an upper portion of the refraction layer may be removed by a planarization process until the light-blocking pattern 150 is exposed thereby forming the preliminary refraction patterns 160 in the openings 152 (FIG. 8). Particularly, the material that forms preliminary refraction patterns 160 may have a refractive index higher than that of a planarization layer 180 (refer to FIG. 12) to be formed subsequently. For example, the preliminary refraction patterns 160 may be made of silicon nitride.

Figure 10:
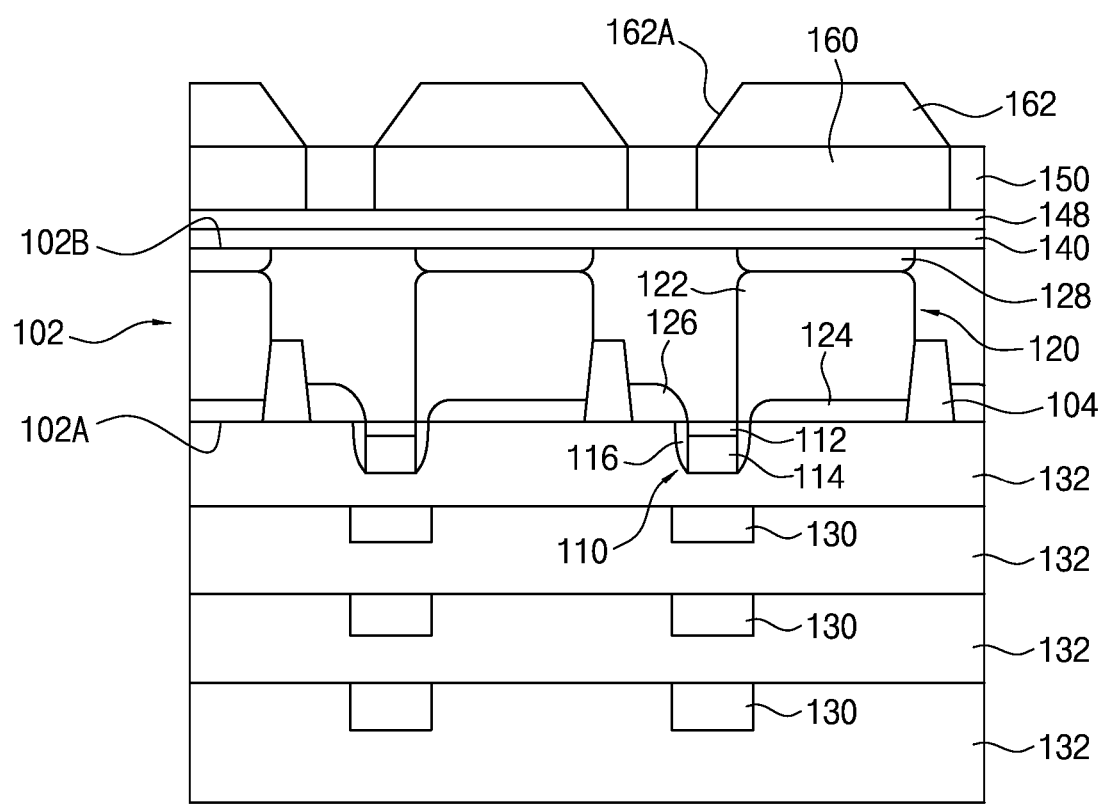

Referring to FIG. 10, photoresist patterns 162 may be formed on the preliminary refraction patterns 160. Particularly, the photoresist patterns 162 may have inclined side surfaces 162A as shown in FIG. 10 so that a width of the photoresist patterns 162 is reduced in the upward direction with respect to the orientation of FIG. 10 on the sheet. In general, the width of photoresist patterns 162 is larger adjacent the backside surface 102B than distal to the backside surface 102B. For example, the photoresist patterns 162 may be formed by a double exposure process or a multiple exposure process.

Figure 11:
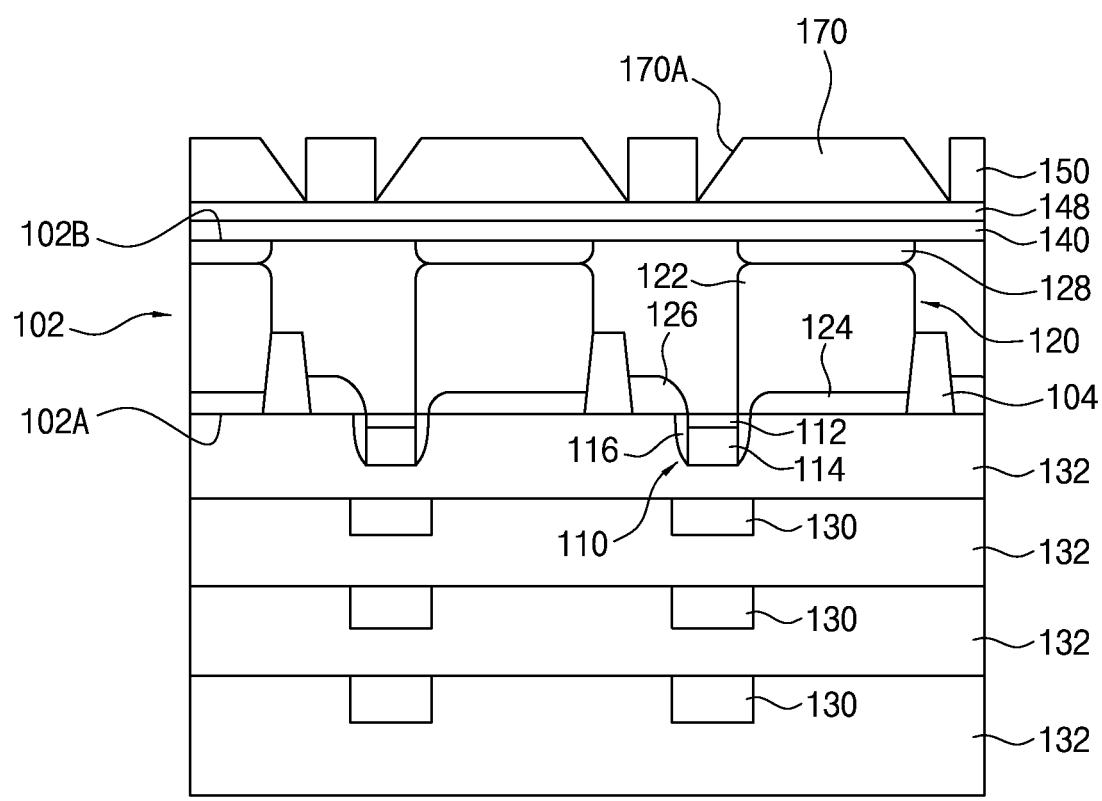

Referring to FIG. 11, edge portions of the preliminary refraction patterns 160 (FIG. 10) may be removed so as to form refraction patterns 170 in the openings 152. For example, the edge portions of the preliminary refraction patterns 160 may be removed by an anisotropic etching process using the photoresist patterns 162 as an etching mask. At this time, the photoresist patterns 162 may be removed at the same rate as the preliminary refraction patterns 160 during the anisotropic etching process, and thus refraction patterns 170 having the same shape as the photoresist patterns 162 may be formed in the openings 152. That is, the refraction patterns 170 may have inclined side surfaces 170A so that a width of the refraction patterns 170 is reduced upward (i.e., thicker proximal to the backside surface 102B and thinner distal to the backside surface 102B).

After forming the refraction patterns 170, an ashing or stripping process may be performed to remove a photoresist residue remaining on the refraction patterns 170, and a cleaning process may be performed to remove the etching residue.

Further, a heat treatment process may be performed to remove defects of the refraction patterns 170. For example, the heat treatment process may be performed at a temperature of about 300° C. to about 450° C. for about 20 minutes to about 120 minutes in an atmosphere containing nitrogen and hydrogen, thereby removing dangling bonds generated during the anisotropic etching process. Alternatively, the heat treatment process may be performed after forming the subsequent planarization layer 180.

Figure 12:
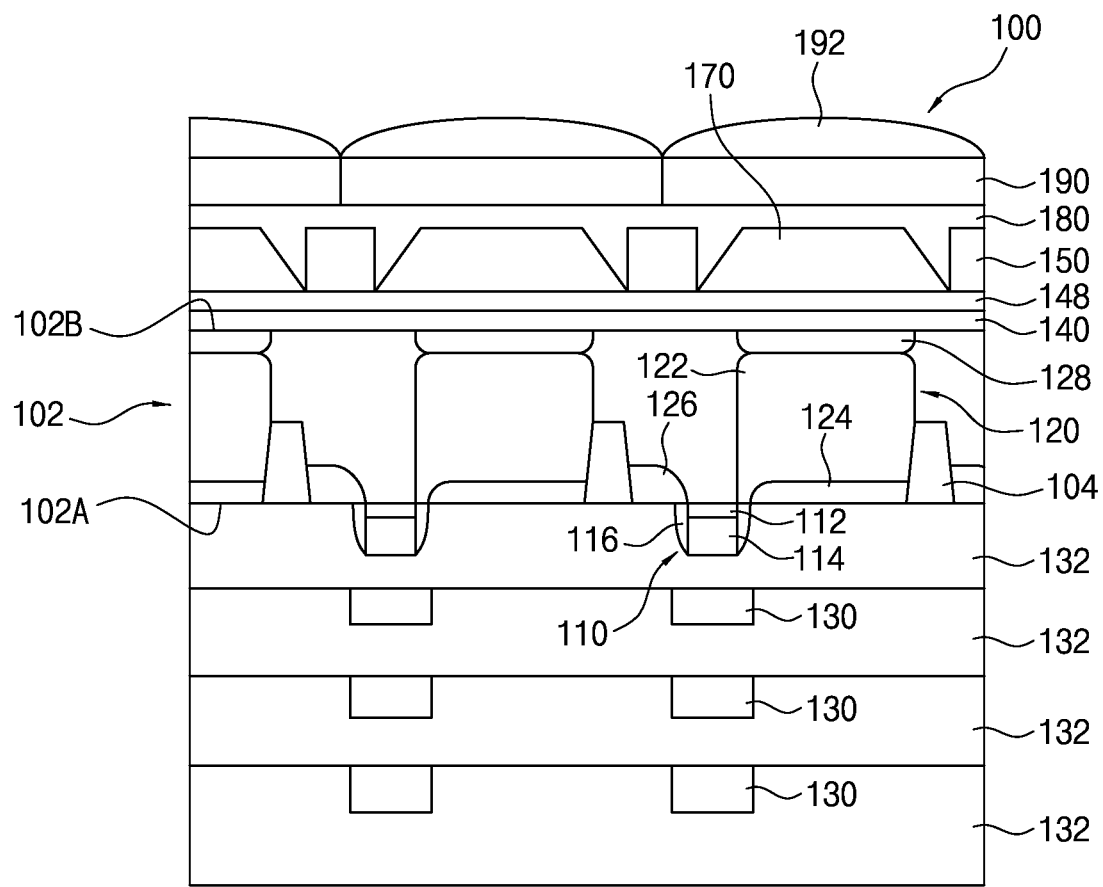

Referring to FIG. 12, a planarization layer 180 may be formed on the light-blocking pattern 150 and the refraction patterns 170, and a color filter layer 190 and a micro lens array 192 may be formed on the planarization layer 180. The planarization layer 180 may be formed of a material having a refractive index lower than the refractive patterns 170, for example, silicon oxide or photoresist material.

In accordance with the exemplary embodiments of the present disclosure as described above, the backside illuminated image sensor 100 may include the refraction patterns 170 for condensing the light passing through the micro lens array 192 and the color filter layer 190 into the pixel regions 120. Particularly, the refraction patterns 170 may be disposed in the openings 152 of the light-blocking pattern 150 and may have the inclined side surfaces 170A. The light incident on the inclined side surfaces 170A may be refracted into the pixel regions 120, and thus the light condensing efficiency of the backside illuminated image sensor 100 may be significantly increased, and the crosstalk of the backside illuminated image sensor 100 may be decreased.

Although the backside illuminated image sensor 100 and the method of manufacturing the same have been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A backside illuminated image sensor having a backside surface and a frontside surface arranged opposite one another, the backside illuminated image sensor comprising:
    a plurality of pixel regions disposed in a substrate that defines the frontside surface and the backside surface;
    a light-blocking pattern disposed on the backside surface and defining a plurality of openings, each of the plurality of openings corresponding to one of the plurality of pixel regions;
    a color filter layer disposed on the light-blocking pattern;
    a micro lens array disposed on the color filter layer;
    a plurality of refraction patterns, each one of the plurality of refraction patterns disposed in a corresponding one of the plurality of openings to condense light passing through the micro lens array and the color filter layer into the pixel regions; and
    an anti-reflective layer disposed on the backside surface of the substrate,
    wherein the anti-reflective layer comprises a metal oxide layer disposed on the backside surface of the substrate, a silicon oxide layer disposed on the metal oxide layer, and a silicon nitride layer disposed on the silicon oxide layer.

2. The backside illuminated image sensor of claim 1, wherein each of the refraction patterns has inclined side surfaces so that a width of the refraction patterns is thicker proximal to the backside surface and thinner distal to the backside surface.

3. The backside illuminated image sensor of claim 1, further comprising a planarization layer disposed on the light-blocking pattern and the refraction patterns, wherein the color filter layer is disposed on the planarization layer.

4. The backside illuminated image sensor of claim 3, wherein the refraction patterns have a refractive index higher than that of the planarization layer.

5. The backside illuminated image sensor of claim 1, wherein the refraction patterns comprise silicon nitride.

6. The backside illuminated image sensor of claim 1, further comprising an insulating layer disposed on the anti-reflective layer, wherein the light-blocking pattern and the refraction patterns are disposed on the insulating layer.

7. The backside illuminated image sensor of claim 1, wherein each of the pixel regions comprises:
    a charge accumulation region disposed in the substrate; and
    a frontside pinning layer disposed between the frontside surface and the charge accumulation region.

8. The backside illuminated image sensor of claim 7, wherein the each of the pixel regions further comprises a backside pinning layer disposed between the backside surface and the charge accumulation region.

9. A method of manufacturing a backside illuminated image sensor, the method comprising:
    forming a plurality of pixel regions in a substrate that defines a frontside surface and a backside surface;
    forming a light-blocking pattern defining a plurality of openings on the backside surface, each of the plurality of openings corresponding to one of the plurality of pixel regions;
    forming a plurality of refraction patterns, wherein each of the plurality of refraction patterns is arranged in a corresponding one of the plurality of openings;
    forming a color filter layer on the light-blocking pattern and the plurality of refraction patterns;
    forming a micro lens array on the color filter layer, and
    forming an anti-reflective layer on the backside surface of the substrate,
    wherein the anti-reflective layer comprises a metal oxide layer disposed on the backside surface of the substrate, a silicon oxide layer disposed on the metal oxide layer, and a silicon nitride layer disposed on the silicon oxide layer,
    wherein the plurality of refraction patterns are configured to condense light passing through the micro lens array and the color filter layer into the pixel regions.

10. The method of claim 9, wherein forming the refraction patterns comprises:
    forming preliminary refraction patterns in the openings; and
    removing edge portions of the preliminary refraction patterns to form the refraction patterns,
    wherein each of the refraction patterns has inclined side surfaces so that it is thicker proximal to the backside surface and thinner distal to the backside surface.

11. The method of claim 10, wherein forming the refraction patterns further comprises:
    forming photoresist patterns each having inclined side surfaces on the preliminary refraction patterns,
    wherein the edge portions of the preliminary refraction patterns are removed by an anisotropic etching process using the photoresist patterns as an etching mask.

12. The method of claim 11, wherein the photoresist patterns are removed at the same rate as the preliminary refraction patterns during the anisotropic etching process.

13. The method of claim 9, further comprising forming a planarization layer on the light-blocking pattern and the refraction patterns, wherein the color filter layer is formed on the planarization layer.

14. The method of claim 13, wherein the refraction patterns have a refractive index higher than a refractive index of the planarization layer.

15. The method of claim 9, further comprising performing a heat treatment process to remove defects of the refraction patterns.

16. The method of claim 9, further comprising forming an insulating layer on the anti-reflective layer, wherein the light-blocking pattern and the plurality of refraction patterns are formed on the insulating.

* * * * *